United States Patent
Yamazaki

[11] Patent Number: 5,872,375
[45] Date of Patent: Feb. 16, 1999

[54] SEMICONDUCTOR DEVICE INCLUDING A PAIR OF FIELD EFFECT TRANSISTORS FORMED IN A DEPRESSION

[75] Inventor: Shunpei Yamazaki, Tokyo, Japan

[73] Assignee: Semiconductor Energy Laboratory Co., Ltd., Kanagawa, Japan

[21] Appl. No.: 424,193

[22] Filed: Apr. 19, 1995

Related U.S. Application Data

[62] Division of Ser. No. 168,360, Dec. 17, 1993, Pat. No. 5,464,780, which is a continuation of Ser. No. 735,057, Jul. 24, 1991, abandoned.

[30] Foreign Application Priority Data

Jul. 25, 1990 [JP] Japan .................................... 2-196869
Jul. 25, 1990 [JP] Japan .................................... 2-196870

[51] Int. Cl.[6] .................................................. H01L 29/76
[52] U.S. Cl. .......................... 257/330; 257/329; 257/622
[58] Field of Search .................................. 257/302, 329, 257/330, 408, 618, 622, 623, 344, 202, 208

[56] References Cited

U.S. PATENT DOCUMENTS

| 4,734,384 | 3/1988 | Tsuchiya | 437/203 |
|---|---|---|---|
| 4,786,953 | 11/1988 | Morie et al. | 257/331 |
| 4,845,539 | 7/1989 | Inoue | 257/302 |
| 4,907,048 | 3/1990 | Huang | 257/344 |
| 4,920,065 | 4/1990 | Chin et al. | 457/203 |
| 4,957,383 | 9/1990 | Baglee | 437/203 |
| 5,017,504 | 5/1991 | Nishimura et al. | 437/40 |
| 5,027,173 | 6/1991 | Satoh | 354/55 |
| 5,032,882 | 7/1991 | Okumura et al. | 357/51 |
| 5,047,359 | 9/1991 | Nagatomo | 437/35 |
| 5,053,842 | 10/1991 | Kojima | 257/316 |
| 5,293,053 | 3/1994 | Malhi et al. | 257/330 |
| 5,302,843 | 4/1994 | Yamazaki | 257/329 |

FOREIGN PATENT DOCUMENTS

| 62-269363 | 8/1987 | Japan | 257/302 |
|---|---|---|---|
| 63-199456 | 5/1988 | Japan | 257/302 |
| 8902655 | 6/1989 | WIPO | 357/23.4 |

*Primary Examiner*—Olik Chaudhuri
*Assistant Examiner*—Nathan K. Kelley
*Attorney, Agent, or Firm*—Sixbey, Friedman, Leedom & Ferguson, P.C.; Gerald J. Ferguson, Jr.; Jeffrey L. Costellia

[57] ABSTRACT

A field effect transistor is formed on a side surface of a rectangular parallelepiped depression formed in the upper surface of a single crystalline substrate. The orientation of the side surface is substantially selected in the (100) plane or an equivalent plane of the crystalline structure of the substrate. A gate electrode is formed on the side surface with a gate insulating film therebetween. Source and Drain regions are formed in the bottom of the depression and the surface of the substrate adjacent to the depression by ion implantation with the gate electrode as a mask.

14 Claims, 4 Drawing Sheets

SEMICONDUCTOR DEVICE INCLUDING A PAIR OF FIELD EFFECT TRANSISTORS FORMED IN A DEPRESSION

This is a Divisional application of Ser. No. 08/168,360, filed Dec. 17, 1993 now U.S. Pat. No. 5,464,780; which itself is a continuation of application Ser. No. 07/735,057, filed Jul. 24, 1991, now abandoned.

BACKGROUND OF THE INVENTION

1. Field of the Invention

The present invention relates to a semiconductor device and a method of manufacturing the same and, more particularly to a pair of gate insulated field effect transistors and an improved technique suitable for constructing ULSIs of the packing density ranging from 16M bits to 16 G bits.

2. Description of the Prior Art

An example of a MIS FET associated with capacitances is shown in FIG. 1(A) to form one bit storage element of a semiconductor memory device. A semiconductor substrate 1 is partitioned by a field insulating film 3 into a number of active regions, only one of which is illustrated in the figure. An FET 10 formed within the active region of the substrate 1 comprises lightly doped source and drain regions 4 and 5 flanked respectively with heavily doped impurity regions 14 and 15 for facilitating formation of ohmic contact, a gate electrode 18 insulated from a channel region located between the source and the drain regions 4 and 5 by means of an insulating film 2. A capacitor 20 comprises an impurity semiconductor region 21 functioning as a first electrode and a polysilicon film 23 functioning as a second electrode insulated from the first electrode 21 by an intervening dielectric film 22. Numerals 38 and 38' in the figure designate shoulder portions 38 and 38' provided for the purpose of formation of the source and the drain regions 4 and 5 in such a dual structure. The corresponding circuit diagram of this structure is shown in FIG. 1(B), which constitutes a unit memory cell of 1Tr/Cell DRAM.

Since the unit structure of this prior art is constructed in a one-dimensional geometry, there is a limitation upon the packing density of the integration. More simple and effective structure is required for increasing the packing density.

BRIEF SUMMARY OF THE INVENTION

It is an object of the present invention to provide a semiconductor device.

It is another object of the present invention to provide a pair of gate insulated field effect transistors suitable for constituting VLSIs having high packing densities.

It is a further object of the present invention to provide a simplified method of manufacturing such gate insulated field effect transistors.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a depression is formed in a single crystalline semiconductor substrate and a gate electrode is formed on a side surface of the depression with a gate insulating film therebetween and a first impurity region of a first conductivity type is provided in the upper surface of the semiconductor substrate and a second impurity region of the first conductivity type is provided at the bottom surface of the depression to form a channel region between the first impurity region and the second impurity region.

In accordance with an aspect of the present invention, a rectangular parallelepiped depression is formed in a single crystalline semiconductor substrate and provided with a pair of triangular or rectangular gate electrodes on opposite side surfaces of the depression in order to constitute a pair of vertical-lateral type field effect transistors. The channel regions of the transistors are formed on the opposed side surfaces of the depression in the vertical direction just beside the pair of gate electrodes with a gate insulating film therebetween whereas the drain and source regions are formed on the upper surface of the substrate immediately adjacent to the depression and the bottom surface of the depression. Contact holes of the order of 0.1 to 0.5 $\mu$m square can easily be opened above the source or drain regions provided in horizontal planes. The formation of such small holes is very difficult in the cases of source and drain regions formed in the vertical planes of the depression. The source and drain regions are formed typically by ion implantation with the gate electrodes as a mask with respect to the lateral and vertical directions. By this structure, one transistor can be formed within an area of 1 $\mu$m square to 10 $\mu$m square with the channel length decreased to 0.03 $\mu$m to 1 $\mu$m so that 16 Mega bits to 16 Giga bits ULSIs having frequency response speeds of 1 to 10 GHz can be manufactured without electron beam process.

Preferably, the orientation of the opposed side surfaces are selected to be in the (100) or equivalent plane of the crystalline structure of the substrate. This selection reduces formation of interface states due to positive charge generation caused by dangling bonds of silicon atoms. The orientation of the other opposed side surfaces perpendicular thereto are also selected to be in the (100) or equivalent plane of the crystalline structure of the substrate so that formation of parasitic channels is prevented.

Furthermore, the drain and source regions are preferably formed respectively in dual structures each comprising a heavily doped region and a lightly doped region, commonly called the LDD structure. The ends of the gate electrodes are positioned at the ends of the channel regions or slightly extend to the adjacent lightly doped regions but not to reach the heavily doped region beyond the lightly doped regions in order to avoid formation of offset structure of gate electrodes and facilitate manufacture in relaxed conditions.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Referring now to FIGS. 2(A) through 2(D), which illustrate a first preferred embodiment of the invention, a manufacturing method for n-channel MIS FETs will be described.

A single crystalline p-type silicon semiconductor of 10 to 500 Ωcm is used as a substrate 1. The orientation and dicing of the substrate have to be carried out in order that the principal surface thereof is parallel to the (100) plane of the crystalline structure. The tolerable angular displacement between the principal surface and the (100) plane is within ±10° in practice. A photoresist is formed by the use of photomask ① on the substrate 1. The surface portion of the substrate 1 is partially removed by etching with the photoresist as a mask in order to form a depression 35. The depression is a parallelepiped having side surfaces parallel to the (100) and (010) planes and sharply extending downward from the edge of the upper surface of the substrate 1 at 90°. For this reason, the etching has to be carried out anisotropically. The depth of the depression is 0.5 to 4 μm, for example, 1.5 μm.

Figure 1A:
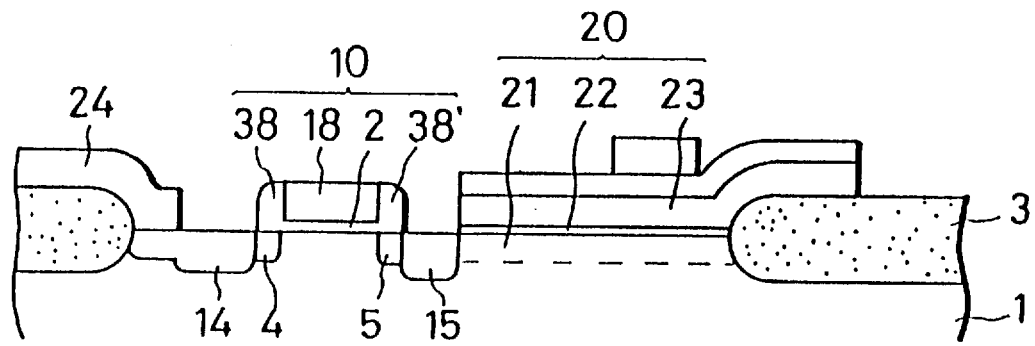
FIG. 1(A) is a cross sectional view showing a storage element of a prior art semiconductor memory.
Figure 1B:
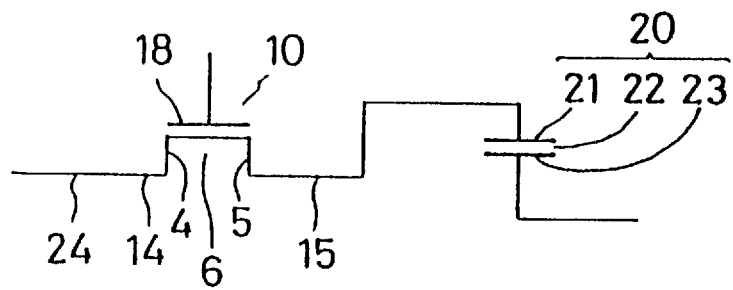
FIG. 1(B) is a circuit diagram showing an equivalent circuit of the storage element illustrated in FIG. 1(A).
Figure 2:
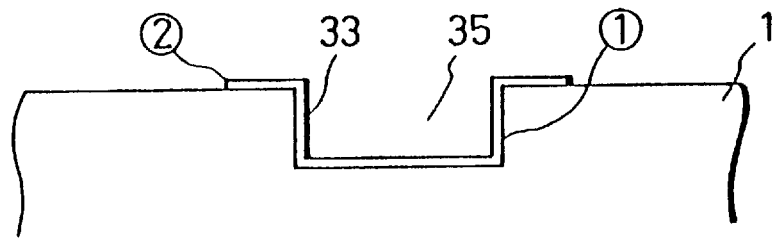
FIGS. 2(A) to 2(D) are cross sectional views showing a manufacturing method of vertical channel FETs in accordance with a first embodiment of the present invention.
FIG. 2(E) is a circuit diagram showing an equivalent circuit of the structures as illustrated in FIGS. 2(D) and 3(D).
FIG. 2(F) is a plan view showing an inverter utilizing the vertical channel FETs in accordance with the present invention.
Figure 2:
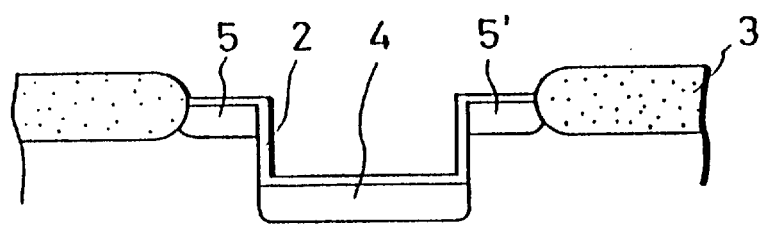
Figure 2:
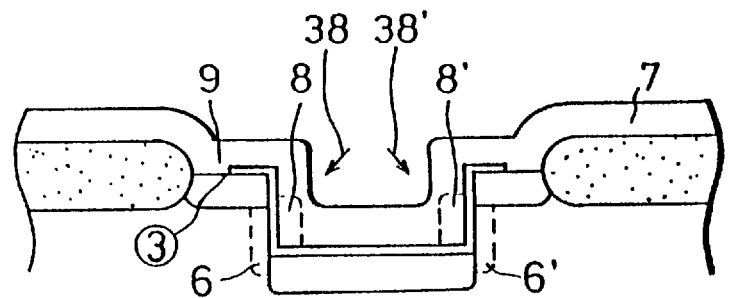
Figure 2:
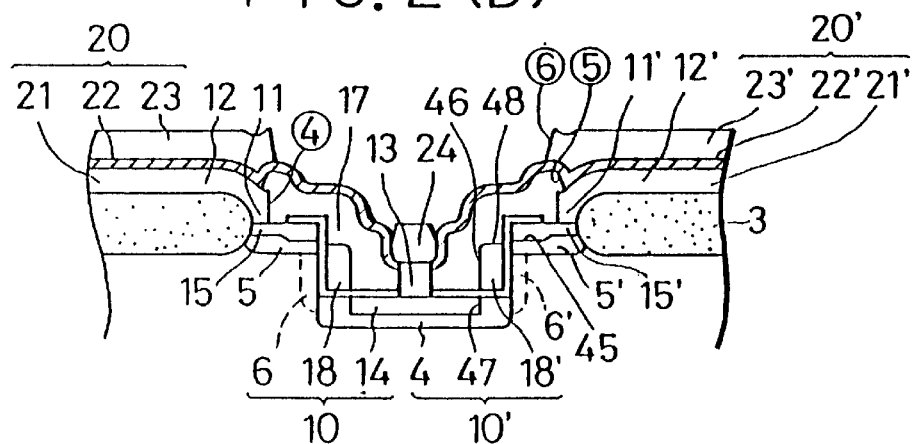
Figure 2:
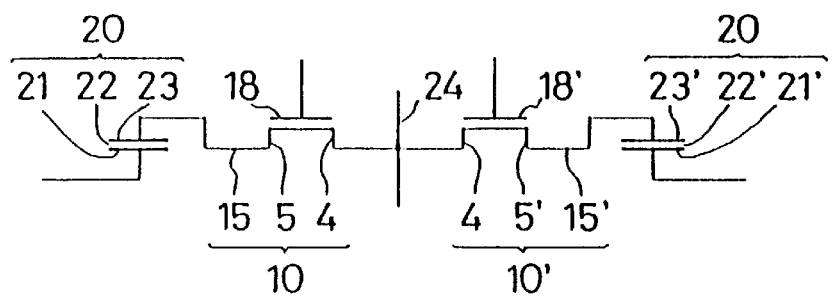
Figure 2:
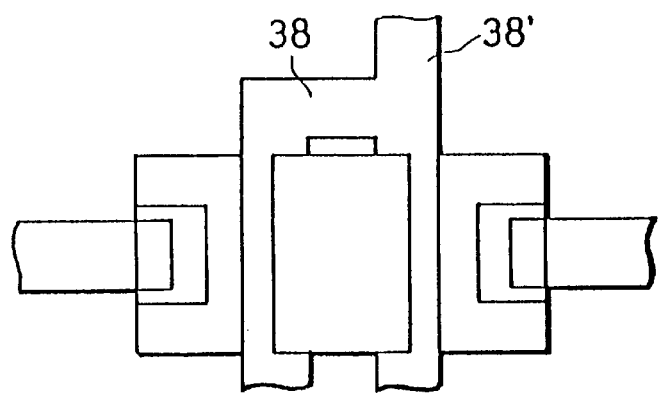

By this orientation of the crystalline structure, the fixed electric charge density at the side surfaces can be decreased by up to 50% of the other crystalline planes such as the (011), (101) or (111) planes. The substrate 1 formed with the depression 35 is coated with a silicon nitride film 33 of a thickness of about 0.1 μm. The silicon nitride film 33 can be replaced by another suitable film, capable of masking the underlying surfaces from the effects of oxidizing atmospheres, such as a silicon oxide film or a laminate film comprising a polycrystalline silicon film and a silicon nitride film. The silicon nitride film 33 is patterned by means of a second photomask ② as illustrated in FIG. 2(A). After the surface region from which the silicon nitride film is removed is doped with a p-type impurity for channel cut, a field insulating film 3 of a thickness of 0.5 to 2 μm is buried in order to define active areas (only one shown in the figure) therebetween. The silicon nitride film 33 is removed and a silicon oxide film 2 is formed instead.

Arsenic or phosphorus is introduced into the substrate by ion implantation in the vertical direction to a depth of 3000 Å to 1 μm, e.g. 5000 Å. The doping is effected at a relatively low density, e.g. $3 \times 10^{16}$ to $5 \times 10^{18}$ cm$^{-3}$ in order to form n-type lightly doped source and drain regions 5 and 5' and 4. Then, ion implantation of boron or boron and arsenic is effected to the opposed side surfaces between the source regions 5 and 5' and the drain regions 4 in horizontal or slanting directions as depicted by arrows 38 and 38' with a suitable mask. This ion implantation may be carried out before the formation of the source regions 5 and 5' and the drain regions 4. Also, the ion implantation may be carried out only for one of the side surfaces depending upon the application. Furthermore, the ion implantation can be carried out twice with different impurities in order to form buried channels. The impurity density (dose amount) of the ion implantation has to be selected to form the channel region in order to have desired threshold voltages. For an enhancement mode, the threshold voltage is chosen between +0.1 V and +1.0 V, e.g. +0.5 V, to obtain a normally-off structure. For a depression mode, the threshold voltage is chosen between −0.1 V and −1.0 V, e.g. −0.5 V, to obtain a normally-on structure. Of course, the signs of the voltages are inverted in the case of a p-channel structure. Although the description is made for transistors utilizing minority carriers, the channel regions can be constructed in order to enable the transistor to operate with majority carriers. The other side surfaces of the depression parallel to the plane of the drawing sheet tends to form parasitic channels to allow leak current flowing between the drain and source regions. Ion implantation of boron or boron and arsenic is effected to these side surfaces in order to accomplish channel cutting. The doping density is selected between the density of the substrate 1 and the density of the source and the drain regions, e.g. to be $1 \times 10^{16}$ cm$^{-3}$ to $2 \times 10^{18}$ cm$^{-3}$. Since the substrate 1 and the insulating films 33 or 2 are damaged by the ion implantation, the entire structure is annealed at a high temperature or in strong light in order to make the substrate 1 to be single crystalline.

The silicon oxide film 2 may be removed followed by forming a silicon oxide film, a silicon nitride film, a tantalum oxide film, or a multi-layered film thereof having 100 to 500 Å thickness in place of the silicon oxide film 2.

Contact holes are opened in the silicon oxide film 2 by the use of a photomask ③. After cleaning the remaining silicon oxide film, an n$^+$-type silicon semiconductor film 7 is deposited by low pressure CVD to a thickness of 0.5 to 2.5 μm. The semiconductor film 7 is coated with a photoresist film, e.g. made of OMR-83 manufactured by TOKYO OHKA KOGYO CO., LTD., followed by patterning in order to leave a mask covering regions to be source electrodes 12 and 12' making contact with the source regions 5 and 5' (FIG. 2(D)). With this photoresist pattern ④, the semiconductor film 7 is subjected to an anisotropic etching. The anisotropic etching has to be carried out with no or substantially no side and taper etching. For example, the anisotropic etching is a low-temperature etching carried out at a vacuum of 0.1 to 0.001 Torr, typically 0.005 to 0.01 Torr by showering a fluorine plasma generated by chemical activation of an etchant gas such as NF$_3$ or CF$_4$ by microwave energy (2.45 GHz) upon the semiconductor film 7 in the normal direction to the substrate 1 which is given a bias voltage. Further, portions of the remaining semiconductor film 7 formed on the other side surfaces of the depression parallel to the plane of the drawing sheet are removed by etching by the use of a photomask. As a result, rectangular or triangular gate electrodes 18 and 18' are formed at the side surfaces of the depression 35. The etching leaves, at the same time, the source electrodes 12 and 12' connected with the source regions 5 and 5' at contacts 11 and 11' by virtue of the photomask ④ which thereafter is removed.

In this case, the width of the gate electrodes 18 and 18' is determined by the thickness of the semiconductor film 7 and the anisotropic effect of the etching rather than photolithography. The width of the gate electrodes 18 and 18' at the lower ends thereof is 0.05 to 1.5 μm, typically 0.2 to 1.0 μm. The height of the gate electrodes 18 and 18' is 0.2 to 2.5 μm, typically 0.3 to 0.8 μm. The etching may be effected with a suitable mask, if desired, to leave leads connected with the gate electrodes and extending over the field insulation film 3. The width of such extension leads is selected to be 1 to 10 μm which may be connected with other circuits. The gate electrodes 18 and 18' have by themselves not so much mechanical strength since their height is substantially large as compared with their width. The virtual strength of the gate electrodes in the structure, however, is satisfactory because the gate electrodes are supported by the side surfaces of the depression.

In the formation procedure of the gate electrodes 18 and 18', the n$^+$-type semiconductor film 7 has been doped with phosphorus at $1\times10^{20}$ cm$^{-3}$ to $1\times10^{21}$ cm$^{-3}$. The doping may be carried out at the same time as the film 7 is deposited by the use of a dopant gas or after the anisotropic etching by diffusion. Alternatively, the semiconductor film can be replaced by a metal or an intermetallic compound film or a dual film of a p$^+$-type or n$^+$-type semiconductor layer and a metal layer or a metallic compound layer such as Si, Mo, W, Pt, MoSi$_2$ and WSi$_2$ or multilayered films consisting of constituent films of these materials. In these cases, the film 7 may be formed by LPCVD, electron beam evaporation or reactive sputtering to a thickness of 0.3 to 1.5 μm typically 0.5 to 0.7 μm. In order to facilitate formation of ohmic contact, heavily doped regions 14, 15 and 15' are formed within the source and drain regions by ion implantation of arsenic at 30 to 150 KeV to densities of $1\times10^{19}$ to $1\times10^{21}$ cm$^{-3}$. The ends 45 of the heavily doped source regions 15 and 15' and the upper ends 48 of the gate electrodes 18 and 18' are self-aligned respectively in the ion implantation. Also, the ends 47 of the heavily doped drain region 14 and the lateral ends 46 of the gate electrodes 18 and 18' are self-aligned respectively. In such self-alignment, the upper ends 48 may be located just aside of the lightly doped source regions 5 and 5' but not reach to the heavily doped source regions 15 and 15' whereas the lateral ends 46 may be located just above the lightly doped drain region 4 but not reach to the heavily doped drain regions 14. An interlayer insulating film 17 is coated over the structure and patterned by the use of a mask ⑤ in order to open a drain contact hole at the center of the drain region 14 followed by formation of a drain contact 13 by selective growth of tungsten and formation of a drain electrode 24. The interlayer insulating film 17 is functioning also to lessen unevenness, which in general is likely and inconvenience peculiar to the cases of ULSIs. As a result, a pair of so called vertical-and-lateral type MIS FETs having 0.1 to 1 μm channel length are formed in a LDD structure.

The pair of FETs may be provided with a pair of capacitances respectively in order to constitute a unit of a 1Tr/cell stacked-type memory capable of storing two bits of information as illustrated in FIGS. 2(D) and 2(E). The capacitance comprises a first electrode 21(21') made of the extension of the source electrode 12(12') over the field insulation film 3, a dielectric film 22(22') and a second electrode 23(23') made of aluminum patterned by the use of a photomask ⑥. The dielectric film is made of an material having a high dielectric constant such as tantalum oxide, titanium oxide, silicon nitride and barium titanate. Alternatively, the first and second electrodes may be formed from silicon semiconductors in order to improve reliability. By forming a large number of such a structure on the substrate 1, a stacked memory device having a high packing density is constructed with the drain 14 as a bit line and the gate 18(18') as a word line.

Referring to FIGS. 3(A) through 3(D), which illustrate a second embodiment of the invention, a pair of n-channel MIS FETs will be described. Most of procedures for manufacturing the FETs are same as those for the FETs as illustrated in FIGS. 2(A) to 2(E) except for the followings so that redundant explanation will be omitted. Similar numerals are given to similar elements throughout FIGS. 2(A) and 2(D) and FIGS. 3(A) to 3(D).

In accordance with the second embodiment, the field insulating film 3 is formed by the use of the silicon nitride film 33 as a mask in advance of the formation of the depression 35. After the depression 35 is formed in the same manner as in the previous embodiment, a silicon oxide film 2 is coated over the depression and patterned to have a central opening at the bottom of the depression. The source, drain and channel regions 5, 5', 4, 6 and 6' are formed in the same manner as in the first embodiment. The heavily doped semiconductor film 7 is formed in the same manner and subjected to anisotropic etching with a suitable mask in order to leave the gate electrodes 18 and 18' and a drain contact 13 together with other leads if necessary for some purpose followed by formation of the heavily doped source and drain regions 15, 15' and 14. After formation of a drain electrode 24, an interlayer insulating film 17 is deposited over the structure and patterned to provide contact holes for the heavily doped drain regions 15 and 15'.

Figure 3A:
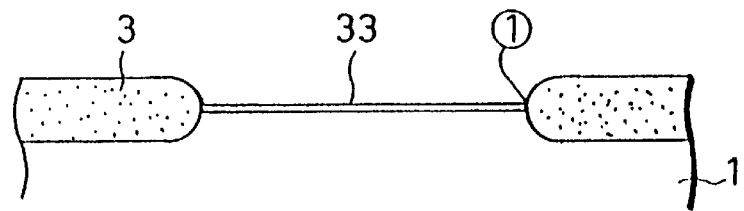
FIGS. 3(A) to 3(D) are cross sectional views showing a manufacturing method of vertical channel FETs in accordance with a second embodiment of the present invention.
Figure 3B:
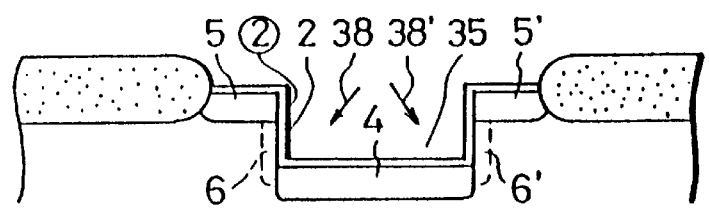
Figure 3C:
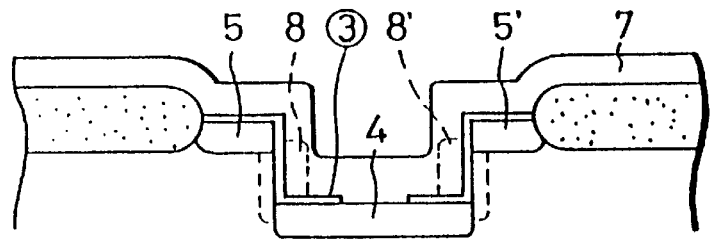
Figure 3D:
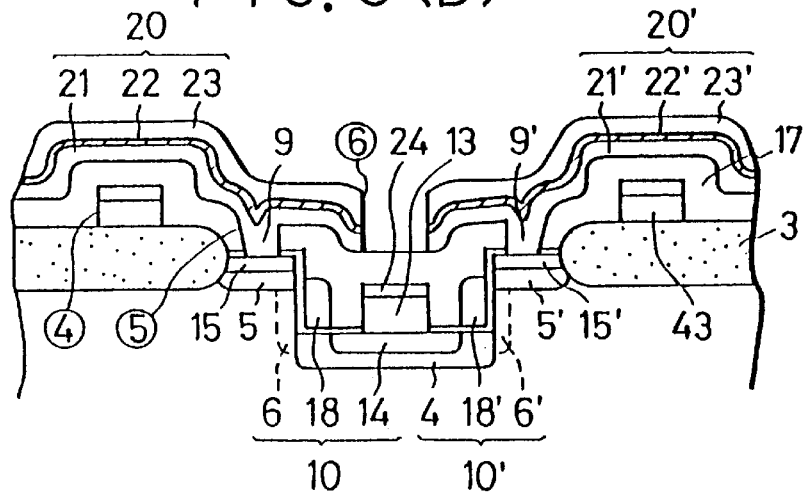

The pair of FETs are provided with a pair of capacitances respectively in order to constitute a unit of a 1Tr/cell stacked-type memory capable of storing two bits of information as illustrated in FIG. 3(D) in the same manner as the first embodiment. The capacitance comprises a 0.1 to 1.0 μm thick first electrode 21(21') made of a silicon semiconductor heavily doped with phosphorus, a dielectric film 22(22') and a second electrode 23(23') made of a metal or a semiconductor. The dielectric film is made of tantalum oxide, titanium oxide, silicon nitride or barium titanate film of 100 to 500 Å thickness. The electrodes 21 and 21' are deposited in direct contact with the heavily doped source regions 15 and 15' at contacts 9 and 9' through the contact holes opened in the insulating film 17. Finally, these three films are separated by the use of a mask ⑥ in order to form a pair of individual capacitances 20 and 20'. By forming a large number of such a structure on the substrate 1, a stacked memory device having a high packing density is constructed with the drain 14 as a bit line and the gate 18(18') as a word line.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Some examples of such modifications are as follows:

A multilayered circuit may be formed, if desired in accordance with the applications, by depositing and patterning an interlayer insulating film over the structures as illustrated in FIGS. 2(D) and 3(D) and depositing and patterning a metallic film over the insulating film by photolithography. For example, amplifiers or logic circuits can be formed with a necessary multilayered circuit associated with the FETs.

An inverter can be constructed in the same manner as the first embodiment except for the following procedures. In the step of channel formation, the ion implantation is carried out with different dose amounts in order to make the transistor 10 to operate an enhancement mode and the transistor 10' to operate a depression mode. In the step of the formation of the gate electrodes, the etching is carried out in order to form connected gate electrodes as illustrated in FIG. 2(F). The formation of the capacitances 20 and 20' is omitted. With this procedure, an inverter is formed with the shortened gate electrodes as its input terminal and the drain electrode 14 as its output terminal. Also, complimentary MOS FETs can be formed in LSI or VLSI structure by forming p-channel FETs adjacent to the above described n-channel FETs and combining them. The p-channel FETs are formed in the same manner except for conductivity type.

When the gate electrodes are formed on the sides of the depression by etching, the extensions thereof can be left at the same time crossing over the field insulating film in order to make electrical connection with MIS FETs, capacitors, resisters or other electric devices formed within adjacent active regions of the same semiconductor chip. Although the conductivity type of the embodiments described above is specified as n-type, p-type transistors are formed in the same manner without substantial change, e.g. only by inverting the conductivity types of the respective semiconductor regions. Also the source and drain regions in the figures are interchangeable depending upon the application or the conductivity type.

The preferred embodiments are described herein as single crystalline silicon semiconductor devices. Other kinds of semiconductors, however, can be utilized also in the same manner. Examples include polycrystalline semiconductors, amorphous semiconductors, semi-amorphous semiconductors or compound semiconductors such as GaAs and InP. Also, the semiconductor substrate may be provided with semiconductor devices as integrated circuits therein.

What is claimed is:

1. A semiconductor device including a pair of insulating gate field effect transistors and a pair of capacitors, said insulated gate field effect transistors comprising:
   a semiconductor substrate having an upper surface;
   a depression being hollowed from said upper surface of said semiconductor substrate and having a pair of first parallel side surfaces, a pair of second parallel side surfaces and a bottom surface;
   a first impurity region being formed below said bottom surface of said depression and having one conductivity type;
   a pair of second impurity regions being formed below said upper surface of said semiconductor substrate and having a same conductivity type as said first impurity region;
   a pair of third impurity regions being formed on said pair of said second impurity regions, each of said third impurity regions having the same conductivity type as each of said second impurity regions at an impurity concentration higher than that of each of said second impurity regions;
   a pair of gate electrodes respectively being formed on said first parallel side surfaces of said depression with a pair of gate insulating films respectively therebetween, each of said gate electrodes being formed between said first impurity region and each of said third impurity regions;
   a pair of channel regions being formed between said first impurity region and said second impurity regions; and
   a fourth impurity region being formed below said bottom surface of said depression, said fourth impurity region having the same conductivity type as said first impurity region at an impurity concentration higher than that of said first impurity region, wherein said fourth impurity region has an end surface in contact with said first impurity region,
   wherein each of said gate electrodes being not overlapped with each of said third impurity regions and said fourth impurity region, each of said capacitors comprising:
   a first electrode being connected with each of said third impurity regions;
   a second electrode; and
   an insulating films between said first electrode and said second electrode.

2. A device according to claim 1 wherein an orientation of the pair of said first parallel side surfaces of said depression is in the (100) plane.

3. A device according to claim 1 wherein said conductivity type of said first, second, third and fourth impurity regions is n-type.

4. A device according to claim 1 wherein each of said first, second, third and fourth impurity regions includes phosphorous or arsenic.

5. A device according to claim 1 wherein each of said first parallel side surfaces is introduced with an impurity in a slanting direction with respect thereto.

6. A device according to claim 5 where said impurity comprises boron or a mixture of boron and arsenic.

7. A device according to claim 1 wherein each of said capacitors is a stacked type.

8. A semiconductor device including first and second insulated gate field effect transistors and first and second capacitors, said first and second insulated gate field effect transistors comprising:
   a semiconductor substrate having an upper surface;
   a depression hollowed from said upper surface of said semiconductor substrate, said depression having a pair of first parallel side surfaces, a pair of second parallel side surfaces and a bottom surface;
   a first lightly doped region of said first and second insulated gate field effect transistors, said first lightly doped region being formed below said bottom surface of said depression;
   second lightly doped regions of said first and second insulated gate field effect transistors, each of said second lightly doped regions being formed below said upper surface of said semiconductor substrate and having a same conductivity type as said first lightly doped region;
   a first heavily doped region of said first and second insulated gate field effect transistors, said first heavily doped region having the same conductivity type as said first lightly doped region at an impurity concentration higher than that of said first lightly doped region, wherein said first heavily doped region has an end surface in contact with said first lightly doped region;
   second heavily doped regions of said first and second insulated gate field effect transistors being formed on said second lightly doped regions, each of said second heavily doped regions having the same conductivity type as each of said second lightly doped regions at an impurity concentration higher than that of each of said second lightly doped regions;
   first and second gate electrodes of said first and second insulated gate field effect transistors being formed on said first parallel side surfaces of said depression with a pair of gate insulating films respectively therebetween, each of said first and second gate electrodes being formed between said first lightly doped region and each of said heavily doped regions; and
   first and second channel regions of said first and second insulated gate field effect transistors being formed between said first lightly doped region and said second lightly doped regions,
   wherein each of said first and second gate electrodes being not overlapped with each of said second heavily doped regions and said first heavily doped region, each of said first and second capacitors comprising:
- a first electrode being connected with a corresponding one of said second heavily doped regions;
- a second electrode; and
- an insulating film between said first electrode and said second electrode.

9. A device according to claim 8 wherein an orientation of the pair of said first parallel side surfaces of said depression is in the (100) plane.

10. A device according to claim 8 wherein said conductivity type of said first, second, third and fourth impurity regions is n-type.

11. A device according to claim 8 wherein each of said first, second, third and fourth impurity regions includes phosphorous or arsenic.

12. A device according to claim 8 wherein each of said first parallel side surfaces is introduced with an impurity in a slanting direction with respect thereto.

13. A device according to claim 12 where said impurity comprises boron or a mixture of boron and arsenic.

14. A device according to claim 8 wherein each of said capacitors is a stacked type.

* * * * *